(12) United States Patent
Tsai et al.

(10) Patent No.: US 12,300,330 B2
(45) Date of Patent: May 13, 2025

(54) MEMORY SYSTEM AND MEMORY ACCESS INTERFACE DEVICE THEREOF FOR SUPPORTING DIFFERENT SPEED MODES

(71) Applicant: REALTEK SEMICONDUCTOR CORPORATION, Hsinchu (TW)

(72) Inventors: Fu-Chin Tsai, Hsinchu (TW);
Ger-Chih Chou, San Jose, CA (US);
Chun-Chi Yu, Hsinchu (TW);
Chih-Wei Chang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 210 days.

(21) Appl. No.: 17/973,005

(22) Filed: Oct. 25, 2022

(65) Prior Publication Data
US 2024/0135999 A1  Apr. 25, 2024
US 2024/0233837 A9  Jul. 11, 2024

(51) Int. Cl.
*G11C 16/32* (2006.01)
*G11C 16/26* (2006.01)

(52) U.S. Cl.
CPC .............. *G11C 16/32* (2013.01); *G11C 16/26* (2013.01)

(58) Field of Classification Search
CPC ................................. G11C 16/32; G11C 16/26
See application file for complete search history.

(56) References Cited

U.S. PATENT DOCUMENTS

| | | | |
|---|---|---|---|
| 8,462,906 B1* | 6/2013 | Ding | H04L 7/00 375/276 |
| 8,669,799 B1* | 3/2014 | King | H03K 5/1565 327/175 |
| 9,570,130 B2 | 2/2017 | Yu | |
| 10,423,386 B1* | 9/2019 | Chung | G11C 8/18 |
| 10,698,846 B2 | 6/2020 | Chi | |
| 10,741,231 B1 | 8/2020 | Tsai | |
| 10,998,061 B1 | 5/2021 | Tsai | |
| 2018/0136878 A1* | 5/2018 | Madpur | G11C 7/10 |
| 2021/0279169 A1* | 9/2021 | Zhang | G06F 9/44505 |

OTHER PUBLICATIONS

Tsai et al. U.S. Appl. No. 17/861,424 (USPTO receipt date: Jul. 11, 2022), Jul. 11, 2022 USA.

* cited by examiner

*Primary Examiner* — J. H. Hur
(74) *Attorney, Agent, or Firm* — WPAT, PC

(57) ABSTRACT

The present disclosure discloses a memory access interface device. A clock generation circuit generates reference clock signals. Each of access signal transmission circuits each includes a duty cycle adjusting circuit, a duty cycle detection circuit, a frequency division circuit and an asynchronous first-in-first-out circuit. The duty cycle adjusting circuit performs duty cycle adjustment on one of the reference clock signals according to a duty cycle detection signal to generate an output clock signal having a duty cycle. The duty cycle detection circuit detects a variation of the duty cycle to generate the duty cycle detection signal. The frequency division circuit divides a frequency of the output clock signal to generate a read clock signal. The asynchronous first-in-first-out circuit receives an access signal from a memory access controller and outputs an output access signal according to the read clock signal to access the memory device accordingly.

20 Claims, 5 Drawing Sheets

MEMORY SYSTEM AND MEMORY ACCESS INTERFACE DEVICE THEREOF FOR SUPPORTING DIFFERENT SPEED MODES

BACKGROUND OF THE INVENTION

1. Field of the Invention

The present disclosure relates to a memory system and a memory access interface device thereof.

2. Description of Related Art

The configuration of single data rate (SDR) having a low speed is used in the early development of NAND flash memory technology. However, due to the increasing requirement of the bandwidth of the products, the conventional configuration of single data rate cannot fulfill the requirement of the speed. As a result, the configuration of non-volatile double data rate (NVDDR) is proposed to break the speed limit.

The specifications of NVDDR having higher and higher speed are further proposed under such a configuration. However, the memory controllers on the market are requested to support all the modes having different speeds and the ability of signal calibration.

SUMMARY OF THE INVENTION

In consideration of the problem of the prior art, an object of the present disclosure is to provide a memory system and a memory access interface device thereof.

The present disclosure discloses a memory access interface device that includes a clock generation circuit and a plurality of access signal transmission circuits. The clock generation circuit is configured for generating a plurality of reference clock signals. Each of the plurality of access signal transmission circuits includes a duty cycle adjusting circuit, a duty cycle detection circuit, a frequency division circuit and an asynchronous first-in-first-out circuit. The duty cycle adjusting circuit is configured for performing duty cycle adjustment on one of the plurality of reference clock signals according to a duty cycle detection signal to generate an output clock signal having a duty cycle. The duty cycle detection circuit is configured for detecting a variation of the duty cycle to generate the duty cycle detection signal. The frequency division circuit is configured for dividing a frequency of the output clock signal to generate a read clock signal. The asynchronous first-in-first-out circuit is configured for receiving an access signal from a memory access controller and outputting an output access signal to a memory device according to the read clock signal to access the memory device accordingly.

The present disclosure also discloses a memory system that includes a memory access controller, a memory device and a memory access interface device. The memory access interface device includes a clock generation circuit and a plurality of access signal transmission circuits. The clock generation circuit is configured for generating a plurality of reference clock signals. Each of the plurality of access signal transmission circuits each includes a duty cycle adjusting circuit, a duty cycle detection circuit, a frequency division circuit and an asynchronous first-in-first-out circuit. The duty cycle adjusting circuit is configured for performing duty cycle adjustment on one of the plurality of reference clock signals according to a duty cycle detection signal to generate an output clock signal having a duty cycle. The duty cycle detection circuit is configured for detecting a variation of the duty cycle to generate the duty cycle detection signal. The frequency division circuit is configured for dividing a frequency of the output clock signal to generate a read clock signal. The asynchronous first-in-first-out circuit is configured for receiving an access signal from a memory access controller and outputting an output access signal to a memory device according to the read clock signal to access the memory device accordingly.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide a memory system and a memory access interface device thereof.

Figure 1:
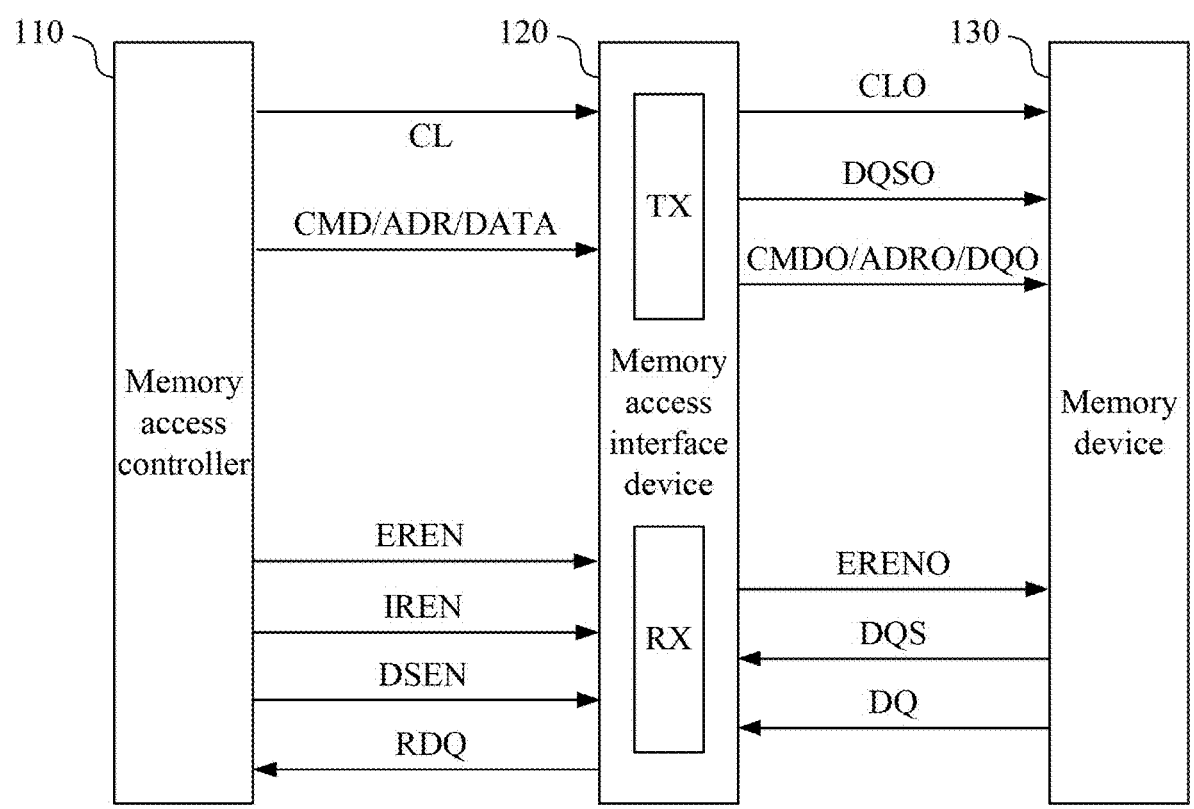
FIG. 1 illustrates a block diagram of a memory system according to an embodiment of the present invention.

Reference is now made to FIG. 1. FIG. 1 illustrates a block diagram of a memory system 100 according to an embodiment of the present invention. The memory system 100 includes a memory access controller 110, a memory access interface device 120 and a memory device 130.

The memory system 100 can be electrically coupled to other modules through such as, but not limited to a system bus (not illustrated). For example, the memory system 100 can be electrically coupled to a processor (not illustrated) through a system bus such that the processor can access the memory system 100.

In an embodiment, the memory access interface device 120 can be such as, but not limited to a physical layer circuit, and the memory access interface device 120 can support the open NAND flash Interface (ONFI) specification.

The memory device 130 is preferably a NAND flash memory that supports from the single data rate (SDR) mode having a relative lower speed to the double data rate (DDR) mode, e.g. NVDDR1, NVDDR2 or NVDDR3, having a relative higher speed. In an embodiment, the NAND flash memory may supports up to 3200 megahertz (MHz).

External access signals, e.g. the access signals from the processor, can be received by the memory access controller 110 first and can be transmitted to the memory access interface device 120. Further, the access signals can be either transmitted from the memory access interface device 120 to the memory device 130 or used as a reference within the memory access interface device 120 to access the memory device 130.

The memory access interface device 120 substantially includes a transmitter TX and a receiver RX. As a result, different access signals may be transmitted depending on the operation of the transmitter TX and the receiver RX.

For the transmitter TX, the memory access controller 110 can receive and transmit the access signals including such as, but not limited to a control signal CL, a command and address signal CMD/ADR and a data signal DATA to the memory access interface device 120. The transmission of the control signal CL can be performed by using one signal path. The transmission of the command and address signal CMD/ADR and the data signal DATA can be performed by using another signal path.

The memory access interface device 120 applies latency on the access signals to generate output access signals. More specifically, the memory access interface device 120 applies latency on the control signal CL and the command and address signal CMD/ADR to adjust the timing thereof to generate an output control signal CLO and an output command and address signal CMDO/ADRO to the memory device 130.

Under the condition that the memory device 130 is the SDR memory device, the data signal DATA includes only one SDR access signal, which is an SDR data signal. The memory access interface device 120 thus operates under an SDR mode to apply latency on the SDR data signal to generate an output SDR data signal to the memory device 130.

Under the condition that the memory device 130 is the DDR memory device, the data signal DATA includes a pair of DDR access signals, which includes a DDR data signal and a data strobe signal DQS. The memory access interface device 120 operates under a DDR mode to adjust the phase of the DDR data signal and the data strobe signal DQS to generate an output DDR data signal and an output data strobe signal DQSO to the memory device 130.

It is appreciated that in FIG. 1, both the SDR data signal and the DDR data signal are labeled as DQ. Further, both the output SDR data signal and output DDR data signal are labeled as DQO.

The transmission of the output control signal CLO can be performed by using one signal path. The transmission of the output command and address signal CMDO/ADRO and the output data signal DQO (either DDR or SDR) can be performed by using another signal path. The transmission of the output data strobe signal DQSO can be performed by using yet another signal path.

For the receiver RX, the memory access controller 110 can receive and transmit the access signals including such as, but not limited to an external read enable signal EREN, an internal read enable signal IREN and a data strobe enable signal DSEN.

According to the signals described above, the memory access interface device 120 can activate the memory device 130, receive the data signal DQ from the activated memory device 130 and sample the data signal DQ to generate a read data signal RDQ to the memory access controller 110.

As a result, the internal data of the memory device 130 can thus be accessed according to the correct timing of the signals described above.

Figure 2:
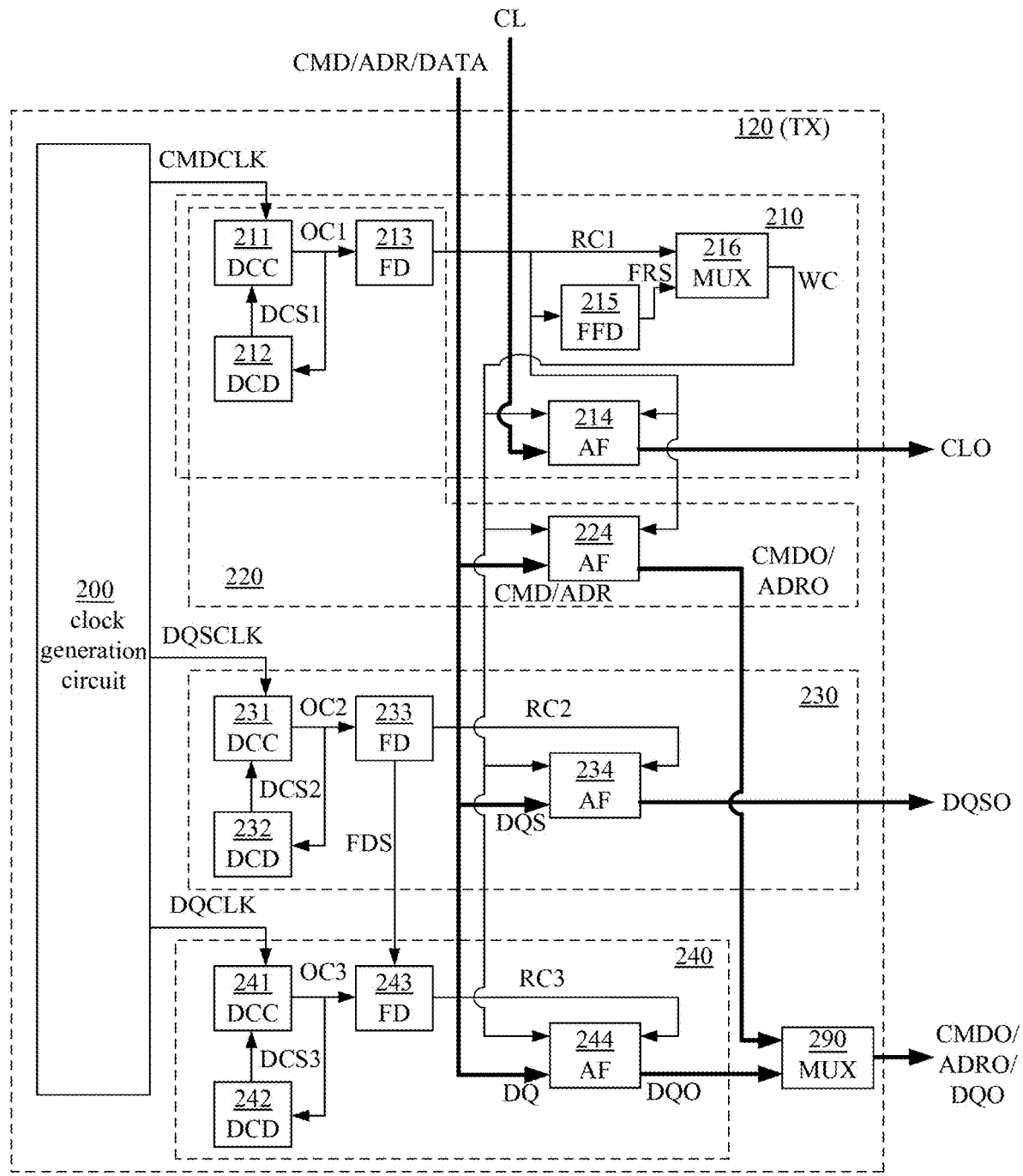
FIG. 2 illustrates a detailed block diagram of the transmitter of the memory access interface device in FIG. 1 according to an embodiment of the present invention.

Reference is now made to FIG. 2 at the same time. FIG. 2 illustrates a detailed block diagram of the transmitter TX of the memory access interface device 120 in FIG. 1 according to an embodiment of the present invention.

The transmitter TX of the memory access interface device 120 includes a clock generation circuit 200 (abbreviated as CGC) and a plurality of access signal transmission circuits 210-240.

The clock generation circuit 200 is configured for generating a plurality of reference clock signals. In an embodiment, the reference clock signals include a command reference clock signal CMDCLK, a data strobe reference clock signal DQSCLK and a data reference clock signal DQCLK. The clock generation circuit 200 can be understood by referring to the U.S. Pat. No. 10,741,231. In an embodiment, the clock generation circuit 200 is implemented by a phase-locked loop (PLL) circuit.

Each of the access signal transmission circuits 210-240 adjusts one of the access signals according to the corresponding reference clock signal to access the memory device 130 in FIG. 1. The access signal transmission circuits 210-240 include an control signal transmission circuit 210, a command and address signal transmission circuit 220, a data strobe signal transmission circuit 230 and a data signal transmission circuit 240.

Take the control signal transmission circuit 210 as an example, the control signal transmission circuit 210 includes a duty cycle adjusting circuit 211 (abbreviated as DCC in FIG. 2), a duty cycle detection circuit 212 (abbreviated as DCD in FIG. 2), a frequency division circuit 213 (abbreviated as FD in FIG. 2) and an asynchronous first-in-first-out circuit 214 (abbreviated as AF in FIG. 2).

The duty cycle adjusting circuit 211 performs duty cycle adjustment on one of the reference clock signals, e.g., the command reference clock signal CMDCLK, according to a duty cycle detection signal DCS1 to generate an output clock signal OC1 having a duty cycle.

The duty cycle detection circuit 212 detects a variation of the duty cycle to generate the duty cycle detection signal DCS1.

The frequency division circuit 213 divides a frequency of the output clock signal OC1 to generate a read clock signal RC1.

Figure 3:
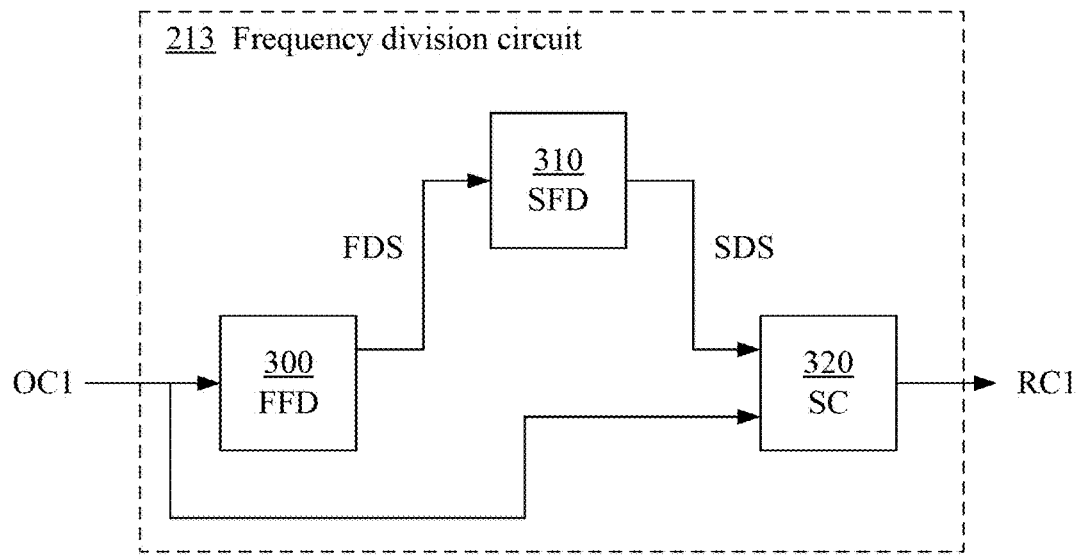
FIG. 3 illustrates a block diagram of the frequency division circuit according to an embodiment of the present invention.

Reference is now made to FIG. 3 at the same time. FIG. 3 illustrates a block diagram of the frequency division circuit 213 according to an embodiment of the present invention.

In an embodiment, the frequency division circuit 213 includes a first frequency divider 300 (abbreviated as FFD in FIG. 3), a second frequency divider 310 (abbreviated as SFD in FIG. 3) and a selection circuit 320 (abbreviated as SC in FIG. 3).

The first frequency divider 300 divides a frequency of the output clock signal OC1 by $2^N$ to generate a first stage frequency divided signal FDS, wherein N is a positive integer, e.g., 1~4. However, the present invention is not limited thereto.

The second frequency divider 310 divides a frequency of the first stage frequency divided signal FDS by 2 to generate a second stage frequency divided signal SDS.

The selection circuit 320 selects the output clock signal OC1 to be outputted in a non-frequency-division mode and selects the second stage frequency divided signal SDS to be outputted in a frequency-division mode, to generate the read clock signal RC1.

As a result, once the memory device 130 in FIG. 1 has a lower speed, the frequency-division mode can be operated to generate the read clock signal RC1 having a lower frequency to support such a memory device 130.

Reference is now made back to FIG. 2. In an embodiment, the clock generation circuit 200 further includes a divide-by-2 frequency division circuit 215 and an input control multiplexer 216.

The divide-by-2 frequency division circuit 215 (abbreviated as FFD in FIG. 2) divides a frequency of the read clock signal RC1 to generate a frequency-divided signal FRS. The input control multiplexer 216 selects one of the frequency-divided signal FRS and the read clock signal RC1 to generate a write clock signal WC fed to the asynchronous first-in-first-out circuit 214.

The asynchronous first-in-first-out circuit 214 receives an access signal, e.g., the control signal CL, from the memory access controller 110 according to the write clock signal WC. The asynchronous first-in-first-out circuit 214 further outputs an output access signal, e.g., the output control signal CLO, related to the memory device 130 according to the read clock signal RC1 to access the memory device 130 accordingly.

In an embodiment, the asynchronous first-in-first-out circuit 214 includes a plurality of flip-flops (not illustrated) each receiving the control signal CL according to a consecutive numbers of timing of the write clock signal WC and a multiplexer (not illustrated) for selecting one of the flip-flops according to the timing of the read clock signal RC1 to output the control signal CL as the output control signal CLO. The detail operation and configuration of the asynchronous first-in-first-out circuit 214 can be understood by referring to either the U.S. Pat. No. 9,570,130 or the U.S. Pat. No. 10,698,846.

As a result, the asynchronous first-in-first-out circuit 214 is able to provide a timing compensation on the control signal CL such that the timing of the output control signal CLO matches the operation of the memory device 130. The depth (i.e., the number of the flip-flops) of the asynchronous first-in-first-out circuit 214 determines the amount of the timing that can be compensated.

Since the write clock signal WC is generated by the divide-by-2 frequency division circuit 215 and the input control multiplexer 216, the frequency of the write clock signal WC either equals to the read clock signal RC1 or is half of the read clock signal RC1.

In an embodiment, the memory access controller 110 is operated under a frequency the same as that of the output access signals that can be processed by the memory device 130. Under such a condition, the write clock signal WC is generated to have the frequency same as that of the read clock signal RC1.

In another embodiment, the memory access controller 110 is operated under a frequency half of that of the output access signals that can be processed by the memory device 130. Under such a condition, the write clock signal WC is generated to have a frequency half of that of the read clock signal RC1.

In an embodiment, the data amount of the control signal CL inputted to the asynchronous first-in-first-out circuit 214 in a single time period of the write clock signal WC is twice of that of the output control signal CLO outputted from the asynchronous first-in-first-out circuit 214 in a single time period of the read clock signal RC1 such that the data throughputs of both the input and the output of the asynchronous first-in-first-out circuit 214 are kept to be the same.

In an embodiment, the write clock signal WC can also serve as the system clock in the transmitter TX of the memory access interface device 120 or can be fed back to control the memory access controller 110.

It is appreciated that by using the configuration described above, the frequency and the phase of the reference clock signals generated by the clock generation circuit 200 can be adjusted without the presence of a higher frequency signal. As a result, the clock generation circuit 200 only needs to provide the reference clock signals having the frequency as high as the data rate of the memory device 130.

The command and address signal transmission circuit 220, the data strobe signal transmission circuit 230 and the data signal transmission circuit 240 has similar but slightly different configurations compared to the control signal transmission circuit 210. The following paragraphs describe the configuration of these signal transmission circuits. The configuration and operation of the components in these transmission circuits identical to the components in the control signal transmission circuit 210 are not further described in detail.

In the present embodiment, the command and address signal transmission circuit 220 shares the duty cycle adjusting circuit 211, the duty cycle detection circuit 212 and the frequency division circuit 213 with the control signal transmission circuit 210, and includes an asynchronous first-in-first-out circuit 224.

The asynchronous first-in-first-out circuit 224 of the command and address signal transmission circuit 220 receives the command and address signal CMD/ADR from the memory access controller 110 according to the write clock signal WC received from the control signal transmission circuit 210. The asynchronous first-in-first-out circuit 224 further outputs the output command and address signal CMDO/ADRO according to the read clock signal RC1 to access the memory device 130 accordingly.

The data strobe signal transmission circuit 230 includes the duty cycle adjusting circuit 231, the duty cycle detection circuit 232, the frequency division circuit 233 and the asynchronous first-in-first-out circuit 234.

For the data strobe signal transmission circuit 230, the duty cycle adjusting circuit 231 thereof receives the data strobe reference clock signal DQSCLK to perform phase adjustment thereon according to the duty cycle detection signal DCS2 to generate the output clock signal OC2 having the duty cycle accordingly, such that the duty cycle detection circuit 232 thereof detects the variation of the duty cycle to generate the duty cycle detection signal DCS2.

Further, for the data strobe signal transmission circuit 230, the frequency division circuit 233 divides a frequency of the output clock signal OC2 to generate a read clock signal RC2, and the asynchronous first-in-first-out circuit 234 thereof receives the data strobe signal DQS according to the write clock signal WC and outputs the output data strobe signal DQSO according to the read clock signal RC2.

It is appreciated that in the present embodiment, the write clock signal WC received by the asynchronous first-in-first-out circuit 234 of the data strobe signal transmission circuit 230 is generated from the control signal transmission circuit 210.

The data signal transmission circuit 240 also includes the duty cycle adjusting circuit 241, the duty cycle detection circuit 242, the frequency division circuit 243 and the asynchronous first-in-first-out circuit 244.

For the data signal transmission circuit 240, the duty cycle adjusting circuit 241 thereof receives the data reference clock signal DQCLK to perform phase adjustment thereon according to the duty cycle detection signal DCS3 to generate the output clock signal OC3 having the duty cycle accordingly, such that the duty cycle detection circuit 242 thereof detects the variation of the duty cycle to generate the duty cycle detection signal DCS3.

Figure 4:
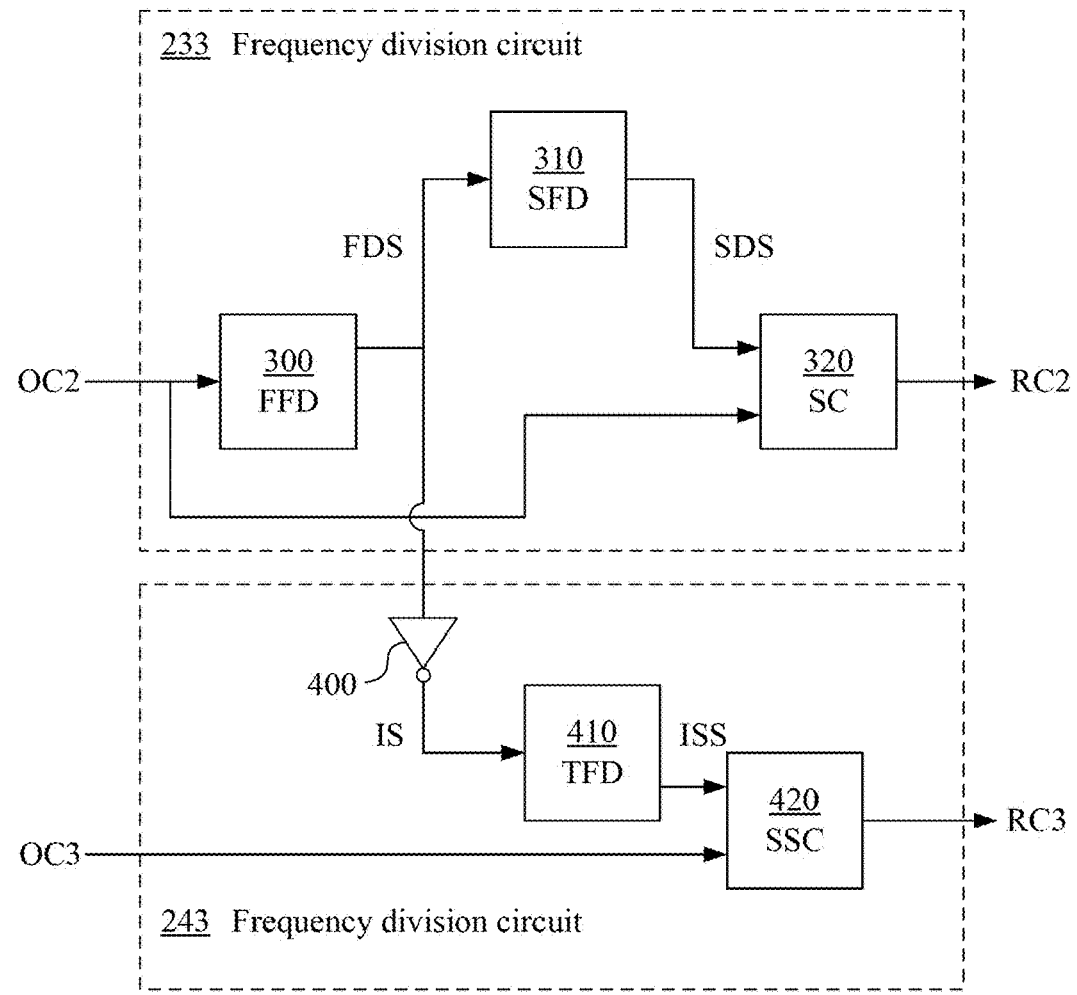
FIG. 4 illustrates a block diagram of the frequency division circuit of the data strobe signal transmission circuit and the frequency division circuit of the data signal transmission circuit according to an embodiment of the present application.

Reference is now made to FIG. 4. FIG. 4 illustrates a block diagram of the frequency division circuit 233 of the data strobe signal transmission circuit 230 and the frequency division circuit 243 of the data signal transmission circuit 240 according to an embodiment of the present application.

The configuration and the operation of the frequency division circuit 233 are identical to those of the frequency division circuit 213. The detail is not described herein.

For the data signal transmission circuit 240, if the read clock signal RC3 is generated by directly dividing the output clock signal OC3, which is how the frequency division circuit 233 operates, the timing margin between the output data strobe signal DQSO and the output data signal DQO becomes smaller when the frequency-division mode is operated. As a result, the frequency division circuit 243 includes a configuration different from that of the frequency division circuit 233.

The frequency division circuit 243 includes an inverter 400, a third frequency divider 410 (abbreviated as TFD in FIG. 4) and a signal selection circuit 420 (abbreviated as SSC in FIG. 4).

The inverter 400 inverts the first stage frequency divided signal FDS from the first frequency divider 300 of the frequency division circuit 213 of the data strobe signal transmission circuit 230 to generate an inverted signal IS.

The third frequency divider 410 divides a frequency of the inverted signal IS by 2 to generate an inverted second stage frequency divided signal ISS.

The signal selection circuit 420 selects the output clock signal OC3 that corresponds to the data signal transmission circuit 240 to be outputted in the non-frequency-division mode and selecting the inverted second stage frequency divided signal ISS to be outputted in the frequency-division mode, to generate the read clock signal RC3.

As a result, for the data signal transmission circuit 240, the asynchronous first-in-first-out circuit 244 thereof receives the data signal DQ according to the write clock signal WC and outputs the output data signal DQO according to the read clock signal RC3.

It is appreciated that in the present embodiment, the write clock signal WC received by the asynchronous first-in-first-out circuit 244 of the data strobe signal transmission circuit 240 is generated from the control signal transmission circuit 210.

Figure 5:
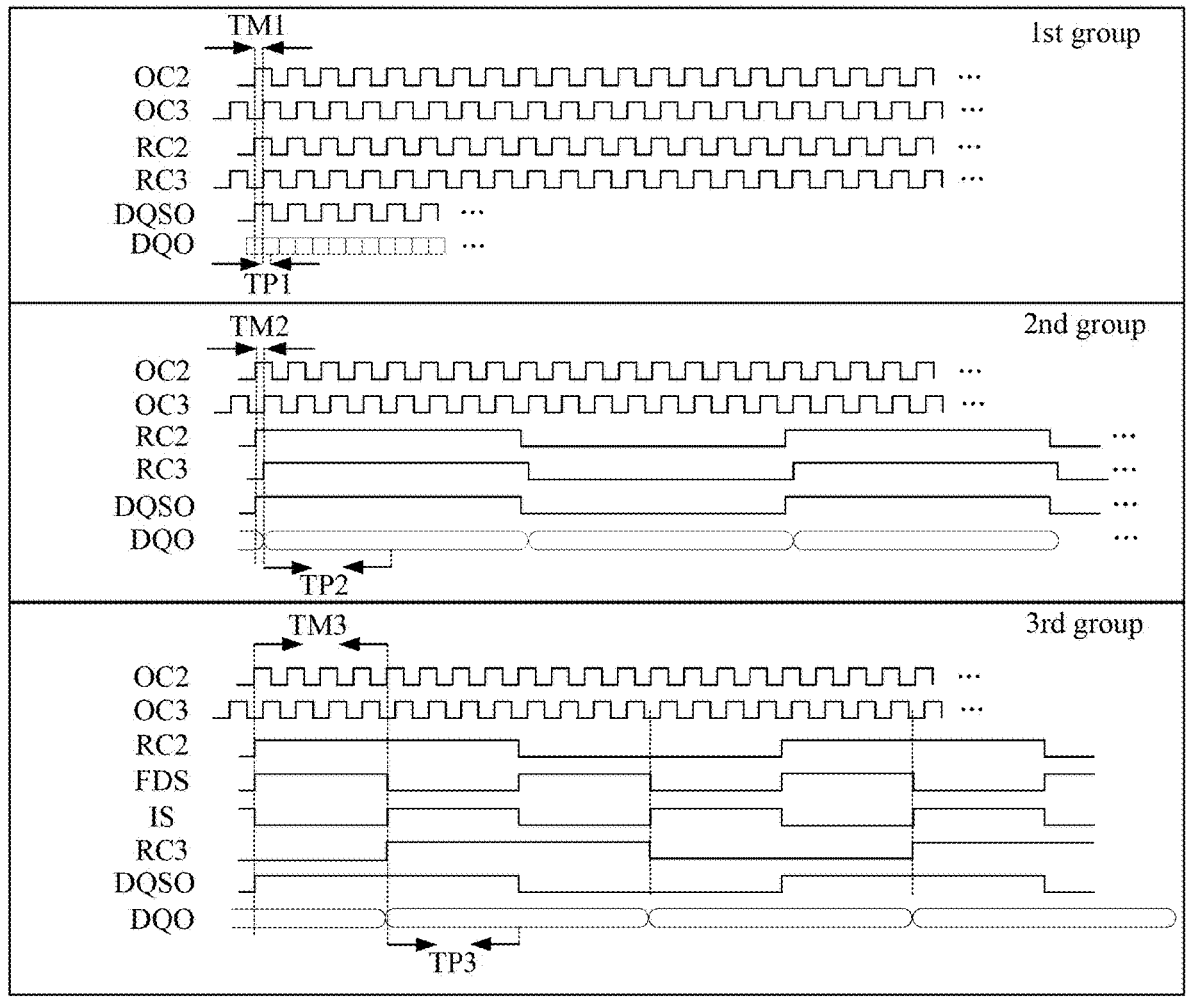
FIG. 5 illustrates a waveform diagram of various signals related to the operation of the frequency division circuit in the data strobe signal transmission circuit and the data signal transmission circuit according to an embodiment of the present application.

Reference is now made to FIG. 5. FIG. 5 illustrates a waveform diagram of various signals related to the operation of the frequency division circuit in the data strobe signal transmission circuit 230 and the data signal transmission circuit 240 according to an embodiment of the present application.

Three groups of signals are illustrated in FIG. 5, in which each of the groups at least includes the output clock signal OC2, the read clock signal RC2 and the output data strobe signal DQSO corresponding to the data strobe signal transmission circuit 230. Each of the groups further includes the output clock signal OC3, the read clock signal RC3 and the output data signal DQO corresponding to the data signal transmission circuit 240. In FIG. 5, the circuit delay is not taken into consideration.

The first group corresponds to the non-frequency-division mode. As a result, the signals therein have a frequency higher than the signals in the other two groups. It is appreciated that in order to obtain a better sampling result, each of the edges of the output data strobe signal DQSO is preferably located at the center of a piece of data of the output data signal DQO. The timing margin TM1, which is a timing difference between an edge of the output data strobe signal DQSO to a nearest edge of the output data signal DQO, is up to the half of the time period TP1 of the output data signal DQO.

The second group corresponds to the 24 (which is 16) frequency-division mode and the condition that the read clock signal RC3 is generated by directly dividing the output clock signal OC3, which is how the frequency division circuit 233 operates. Under such a condition, the timing margin TM2 becomes much smaller than the half of the time period TP2 of the output data signal DQO. Such a small timing margin TM2 makes the edge of the output data strobe signal DQSO become too close to the edge of the output data signal DQO. The read clock signal RC3 generated by directly dividing the frequency of the output clock signal OC3 is thus not beneficial on timing margin.

The third group corresponds to the 24 (which is 16) frequency-division mode and the condition that the read clock signal RC3 is generated by using the frequency division circuit 243 in FIG. 4. More specifically, the first stage frequency divided signal FDS generated by dividing the output clock signal OC2 by 23 (which is 8) is received, the inverted signal IS is generated according to the first stage frequency divided signal FDS and the read clock signal RC3 is generated by dividing the inverted signal IS by 2. As a result, the first stage frequency divided signal FDS and the inverted signal IS are illustrated in the third group. Under such a condition, the timing margin TM3 can be kept to be the half of the time period TP3 of the output data signal DQO such that the possibility that the data signal DQO is transmitted to the memory device 130 accurately according to the output data strobe signal DQSO is higher since the timing margin between the data signal DQO and the output data strobe signal DQSO is large enough.

Reference is now made back to FIG. 2. The transmission circuit TX of the memory access interface device 120 further includes a signal selection multiplexer 290 electrically coupled to the data signal transmission circuit 240 and the command and address signal transmission circuit 220. The signal selection multiplexer 290 selects one of the output data signal DQO and the output command and address signal CMDO/ADRO to be transmitted through the same output path to the memory device 130.

Figure 6:
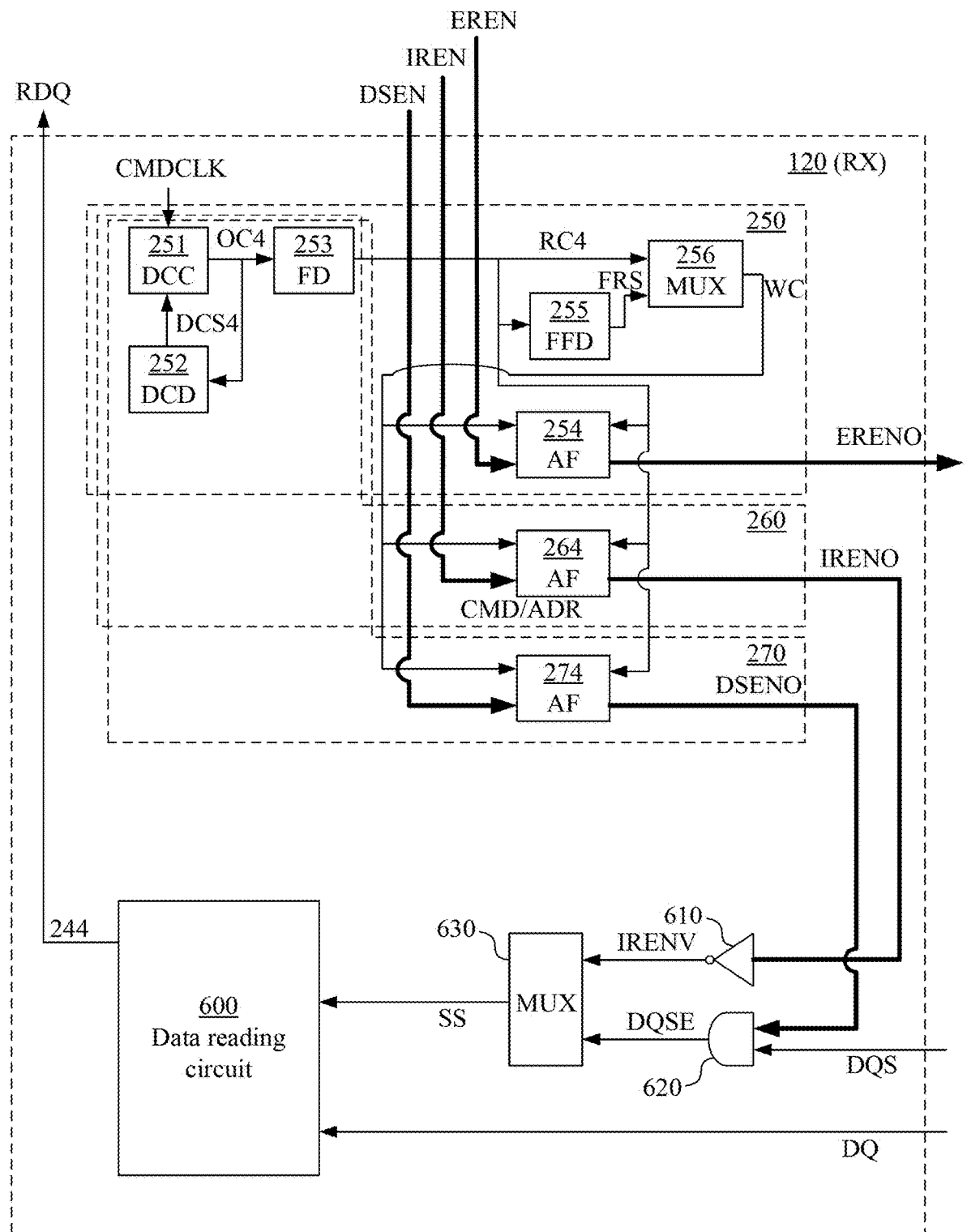
FIG. 6 illustrates a detailed block diagram of the receiver of the memory access interface device in FIG. 1 according to an embodiment of the present invention.

Reference is now made to FIG. 6. FIG. 6 illustrates a detailed block diagram of the receiver RX of the memory access interface device 120 in FIG. 1 according to an embodiment of the present invention.

The memory access interface device 120 further includes read signal transmission circuits 250, 260 and 270.

The access signal received by each of the read signal transmission circuits 250, 260 and 270 is respectively the external read enable signal EREN, the internal read enable signal IREN and the data strobe enable signal DSEN. The reference clock signal received thereby is the command reference clock signal CMDCLK generated by the clock generation circuit 200 in FIG. 2. The output access signal generated by each of the read signal transmission circuits 250, 260 and 270 is respectively the output external read enable signal ERENO, an output internal read enable signal IRENO and an output data strobe enable signal DSENO.

The read signal transmission circuits 250, 260 and 270 shares a duty cycle adjusting circuit 251, a duty cycle detection circuit 252 and a frequency division circuit 253 together. The read signal transmission circuit 250 includes an asynchronous first-in-first-out circuit 254. The read signal transmission circuit 260 includes an asynchronous first-in-first-out circuit 264. The read signal transmission circuit 270 includes an asynchronous first-in-first-out circuit 274.

In the present embodiment, the read signal transmission circuit 250 further includes a divide-by-2 frequency division circuit 255 and an input control multiplexer 256.

The operation of the circuit components in these read signal transmission circuits 250, 260 and 270 are identical to those in the clock generation circuit 200 illustrated in FIG. 2. No further detail is described herein.

The output external read enable signal ERENO is configured for activating the memory device 130. The output internal read enable signal IRENO and the output data strobe enable signal DSENO are used to generate a sampling signal SS to sample the data signal DQ transmitted from the memory device 130 activated by the output external read enable signal ERENO.

The receiver RX of the memory access interface device 120 further includes a data reading circuit 600, an inverter 610, an enable circuit 620 and a sampling multiplexer 630.

The data reading circuit 600 samples the data signal DQ from the activated memory device 130 according to a sampling signal SS to generate and transmit the read data signal RDQ to the memory access controller 110.

The inverter 610 receives the output internal read enable signal IRENO to output an inverted output internal read enable signal IRENV.

The enable circuit 620 receives the output data strobe enable signal DSENO and the data strobe signal DQS, and being enabled by the output data strobe enable signal DSENO to output an enabled data strobe signal DQSE.

The sampling multiplexer 630 generates the sampling signal SS according to the inverted output internal read enable signal IRENV under the SDR mode and generates the sampling signal SS according to the enabled data strobe signal DQSE under the DDR mode.

The detail operation and configuration of the data reading circuit 600, the inverter 610, the enable circuit 620 and the sampling multiplexer 630 can be understood by referring to the U.S. Pat. No. 10,998,061.

In an embodiment, the data reading circuit 600 is operated according to the write signal WC so as to convert the frequency of the read data signal RDQ to a lower frequency when the memory access controller 110 is operated under a frequency half of that of the output access signals that can be processed by the memory device 130.

It is appreciated that the embodiments described above are merely an example. In other embodiments, it should be appreciated that many modifications and changes may be made by those of ordinary skill in the art without departing, from the spirit of the invention.

In summary, the memory system and the memory access interface device thereof of the present invention allow the clock generation circuit to generate the reference clock signals having the frequency that can be the same as the data rate of the memory device even under the DDR mode. Further, a dynamic timing adjustment mechanism on the access signals can be provided by using the asynchronous first-in-first-out circuits.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A memory access interface device comprising:
   a clock generation circuit configured for generating a plurality of reference clock signals; and
   a plurality of access signal transmission circuits each comprising:
      a duty cycle adjusting circuit configured for performing duty cycle adjustment on one of the plurality of reference clock signals according to a duty cycle detection signal to generate an output clock signal having a duty cycle;
      a duty cycle detection circuit configured for detecting a variation of the duty cycle to generate the duty cycle detection signal;
      a frequency division circuit configured for dividing a frequency of the output clock signal to generate a read clock signal; and
      an asynchronous first-in-first-out circuit configured for receiving an access signal from a memory access controller and outputting an output access signal to a memory device according to the read clock signal to access the memory device accordingly.

2. The memory access interface device of claim 1, wherein the access signal transmission circuits comprise:
   a control signal transmission circuit disposed in a transmitter of the memory access interface device, wherein the access signal received thereby is a control signal, one of the reference clock signals received thereby is a command reference clock signal and the output access signal generated thereby is an output control signal, the control signal transmission circuit further comprises:
      a divide-by-2 frequency division circuit configured for dividing a frequency of the read clock signal to generate a frequency-divided signal; and
      an input control multiplexer configured for selecting one of the frequency-divided signal and the read clock signal to generate a write clock signal to be fed to the asynchronous first-in-first-out circuit of each of the access signal transmission circuits such that the asynchronous first-in-first-out circuit receives the access signal accordingly; and
   a command and address signal transmission circuit disposed in the transmitter and sharing the duty cycle adjusting circuit, the duty cycle detection circuit and the frequency division circuit with the control signal transmission circuit, wherein the access signal received thereby is a command and address signal and the output access signal generated thereby is an output command and address signal.

3. The memory access interface device of claim 2, wherein the frequency division circuit comprised by the control signal transmission circuit comprises:
   a first frequency divider configured for dividing a frequency of the output clock signal by $2^N$ to generate a first stage frequency divided signal, wherein N is a positive integer;
   a second frequency divider configured for dividing a frequency of the first stage frequency divided signal by 2 to generate a second stage frequency divided signal; and
   a selection circuit configured for selecting the output clock signal to be outputted in a non-frequency-division mode and selecting the second stage frequency divided signal to be outputted in a frequency-division mode, to generate the read clock signal.

4. The memory access interface device of claim 1, wherein the access signal transmission circuits comprise:
   a data strobe signal transmission circuit disposed in a transmitter of the memory access interface device, wherein the access signal received thereby is a data strobe signal, one of the reference clock signals received thereby is a data strobe reference clock signal and the output access signal generated thereby is an output data strobe signal; and
   a data signal transmission circuit disposed in the transmitter, wherein the access signal received thereby is a data signal, one of the reference clock signals received thereby is a data reference clock signal and the output access signal generated thereby is an output data signal.

5. The memory access interface device of claim 4, wherein the frequency division circuit comprised by the data strobe signal transmission circuit comprise:
   a first frequency divider configured for dividing a frequency of the output clock signal by $2^N$ to generate a first stage frequency divided signal, wherein N is a positive integer;
   a second frequency divider configured for dividing a frequency of the first stage frequency divided signal by 2 to generate a second stage frequency divided signal; and
   a selection circuit configured for selecting the output clock signal to be outputted in a non-frequency-division mode and selecting the second stage frequency divided signal to be outputted in a frequency-division mode, to generate the read clock signal.

6. The memory access interface device of claim 5, wherein the frequency division circuit comprised by the data signal transmission circuit comprises:
   an inverter configured for inverting the first stage frequency divided signal to generate an inverted signal;
   a third frequency divider configured for dividing a frequency of the inverted signal by 2 to generate an inverted second stage frequency divided signal; and
   a signal selection circuit configured for selecting the output clock signal that corresponds to the data signal transmission circuit to be outputted in the non-frequency-division mode and selecting the inverted second stage frequency divided signal to be outputted in the frequency-division mode, to generate the read clock signal.

7. The memory access interface device of claim 4, wherein the data signal and a command and address signal are received through a same input path from the memory access controller, the memory access interface device further comprises:
   a signal selection multiplexer electrically coupled to the data signal transmission circuit and a command and address signal transmission circuit that receives the command and address signal, and configured for selecting one of the output data signal and an output command and address signal generated by the command and address signal transmission circuit to be transmitted to the memory device.

8. The memory access interface device of claim 1, further comprising a plurality of read signal transmission circuits disposed in a receiver, sharing the duty cycle adjusting circuit, the duty cycle detection circuit and the frequency division circuit together and each of the read signal transmission circuits has the asynchronous first-in-first-out circuit, wherein the access signal received by each of the read signal transmission circuits is respectively an external read enable signal, an internal read enable signal and a data strobe enable signal, one of the reference clock signals received thereby is a command reference clock signal, and the output access signal generated by each of the read signal transmission circuits is respectively an output external read enable signal, an output internal read enable signal and an output data strobe enable signal, in which the output external read enable signal is configured for activating the memory device.

9. The memory access interface device of claim 8, further comprising:
   a data reading circuit disposed in the receiver, and configured for sampling a data signal from the activated memory device according to a sampling signal to generate and transmit a read data signal to the memory access controller;
   an inverter disposed in the receiver, and configured for receiving the output internal read enable signal to output an inverted output internal read enable signal;
   an enable circuit disposed in the receiver, and configured for receiving the output data strobe enable signal and the data strobe signal, and being enabled by the output data strobe enable signal to output an enabled data strobe signal; and
   a sampling multiplexer disposed in the receiver, and configured for generating the sampling signal according to the inverted output internal read enable signal under a single data rate (SDR) mode and generating the sampling signal according to the enabled data strobe signal under a double data rate (DDR) mode.

10. The memory access interface device of claim 9, wherein the read signal transmission circuits further comprise:
    a divide-by-2 frequency division circuit configured for dividing a frequency of the read clock signal to generate a frequency-divided signal; and
    an input control multiplexer configured for selecting one of the frequency-divided signal and the read clock signal to generate a write clock signal to be fed to the asynchronous first-in-first-out circuit of each of the read signal transmission circuits such that the asynchronous first-in-first-out circuit receives the access signal accordingly;
    wherein the data reading circuit is configured for transmitting the read data signal to the memory access controller according to the write clock signal.

11. A memory system comprising:
    a memory access controller;
    a memory device; and
    a memory access interface device comprising:
       a clock generation circuit configured for generating a plurality of reference clock signals; and
       a plurality of access signal transmission circuits each comprising:
          a duty cycle adjusting circuit configured for performing duty cycle adjustment on one of the plurality of reference clock signals according to a duty cycle detection signal to generate an output clock signal having a duty cycle;
          a duty cycle detection circuit configured for detecting a variation of the duty cycle to generate the duty cycle detection signal;
          a frequency division circuit configured for dividing a frequency of the output clock signal to generate a read clock signal; and
          an asynchronous first-in-first-out circuit configured for receiving an access signal from the memory access controller and outputting an output access signal to the memory device according to the read clock signal to access the memory device accordingly.

12. The memory system of claim 11, wherein the access signal transmission circuits comprise:
a control signal transmission circuit disposed in a transmitter of the memory access interface device, wherein the access signal received thereby is a control signal, one of the reference clock signals received thereby is a command reference clock signal and the output access signal generated thereby is an output control signal, the control signal transmission circuit further comprises:
a divide-by-2 frequency division circuit configured for dividing a frequency of the read clock signal to generate a frequency-divided signal; and
an input control multiplexer configured for selecting one of the frequency-divided signal and the read clock signal to generate a write clock signal to be fed to the asynchronous first-in-first-out circuit of each of the access signal transmission circuits such that the asynchronous first-in-first-out circuit receives the access signal accordingly; and
a command and address signal transmission circuit disposed in the transmitter and sharing the duty cycle adjusting circuit, the duty cycle detection circuit and the frequency division circuit with the control signal transmission circuit, wherein the access signal received thereby is a command and address signal and the output access signal generated thereby is an output command and address signal.

13. The memory system of claim 12, wherein the frequency division circuit comprised by the control signal transmission circuit comprises:
a first frequency divider configured for dividing a frequency of the output clock signal by $2^N$ to generate a first stage frequency divided signal, wherein N is a positive integer;
a second frequency divider configured for dividing a frequency of the first stage frequency divided signal to generate a second stage frequency divided signal; and
a selection circuit configured for selecting the output clock signal to be outputted in a non-frequency-division mode and selecting the second stage frequency divided signal to be outputted in a frequency-division mode, to generate the read clock signal.

14. The memory system of claim 11, wherein the access signal transmission circuits comprise:
a data strobe signal transmission circuit disposed in a transmitter of the memory access interface device, wherein the access signal received thereby is a data strobe signal, one of the reference clock signals received thereby is a data strobe reference clock signal and the output access signal generated thereby is an output data strobe signal; and
a data signal transmission circuit disposed in the transmitter, wherein the access signal received thereby is a data signal, one of the reference clock signals received thereby is a data reference clock signal and the output access signal generated thereby is an output data signal.

15. The memory system of claim 14, wherein the frequency division circuit comprised by the data strobe signal transmission circuit comprise:
a first frequency divider configured for dividing a frequency of the output clock signal by $2^N$ to generate a first stage frequency divided signal, wherein N is a positive integer;
a second frequency divider configured for dividing a frequency of the first stage frequency divided signal by 2 to generate a second stage frequency divided signal; and
a selection circuit configured for selecting the output clock signal to be outputted in a non-frequency-division mode and selecting the second stage frequency divided signal to be outputted in a frequency-division mode, to generate the read clock signal.

16. The memory system of claim 15, wherein the frequency division circuit comprised by the data signal transmission circuit comprise:
an inverter configured for inverting the first stage frequency divided signal to generate an inverted signal;
a third frequency divider configured for dividing a frequency of the inverted signal by 2 to generate an inverted second stage frequency divided signal; and
a signal selection circuit configured for selecting the output clock signal that corresponds to the data signal transmission circuit to be outputted in a non-frequency-division mode and selecting the inverted second stage frequency divided signal to be outputted in a frequency-division mode, to generate the read clock signal.

17. The memory system of claim 14, wherein the data signal and a command and address signal are received through a same input path from the memory access controller, the memory access interface device further comprises:
a signal selection multiplexer electrically coupled to the data signal transmission circuit and a command and address signal transmission circuit that receives the command and address signal, and configured for selecting one of the output data signal and an output command and address signal generated by the command and address signal transmission circuit to be transmitted to the memory device.

18. The memory system of claim 11, wherein the access signal transmission circuits further comprise a plurality of read signal transmission circuits disposed in a receiver, sharing the duty cycle adjusting circuit, the duty cycle detection circuit and the frequency division circuit together and each of the read signal transmission circuits has the asynchronous first-in-first-out circuit, wherein the access signal received by each of the read signal transmission circuits is respectively an external read enable signal, an internal read enable signal and a data strobe enable signal, and the output access signal generated by each of the read signal transmission circuits is respectively an output external read enable signal, an output internal read enable signal and an output data strobe enable signal, in which the output external read enable signal is configured for activating the memory device.

19. The memory system of claim 18, wherein the memory access interface device further comprises:
a data reading circuit disposed in the receiver, and configured for sampling a data signal from the activated memory device according to a sampling signal to generate and transmit a read data signal to the memory access controller;
an inverter disposed in the receiver, and configured for receiving the output internal read enable signal to output an inverted output internal read enable signal;
an enable circuit disposed in the receiver, and configured for receiving the output data strobe enable signal and the data strobe signal, and being enabled by the output data strobe enable signal to output an enabled data strobe signal; and a sampling multiplexer disposed in the receiver, and configured for generating the sampling signal according to the inverted output internal read enable signal under a single data rate (SDR) mode and generating the sampling signal according to the enabled data strobe signal under a double data rate (DDR) mode.

20. The memory system of claim 19, wherein the read signal transmission circuits further comprise:
a divide-by-2 frequency division circuit configured for dividing a frequency of the read clock signal to generate a frequency-divided signal; and
an input control multiplexer configured for selecting one of the frequency-divided signal and the read clock signal to generate a write clock signal to be fed to the asynchronous first-in-first-out circuit of each of the read signal transmission circuits such that the asynchronous first-in-first-out circuit receives the access signal accordingly;
wherein the data reading circuit is configured for transmitting the read data signal to the memory access controller according to the write clock signal.

* * * * *